United States Patent
Jun

[19]

[11] Patent Number: 6,043,149
[45] Date of Patent: Mar. 28, 2000

[54] METHOD OF PURIFYING A METAL LINE IN A SEMICONDUCTOR DEVICE

[75] Inventor: Young Kwon Jun, Seoul, Rep. of Korea

[73] Assignee: LG Semicon Co., Ltd., Chungcheongbuk-do, Rep. of Korea

[21] Appl. No.: 08/899,210

[22] Filed: Jul. 23, 1997

[30] Foreign Application Priority Data

Dec. 24, 1996 [KR] Rep. of Korea ................ 96-71464

[51] Int. Cl.[7] ................................................. H01L 21/70
[52] U.S. Cl. ........................ 438/658; 438/672; 438/681; 438/687; 438/688
[58] Field of Search .................................. 438/625, 672, 438/627, 643, 600, 687, 688, 798, 658, 681, 628, 644, 660

[56] References Cited

U.S. PATENT DOCUMENTS

| | | | |
|---|---|---|---|
| 4,710,398 | 12/1987 | Homma et al. ............................ | 438/235 |
| 5,143,867 | 9/1992 | D'Heurle et al. ......................... | 438/188 |
| 5,191,099 | 3/1993 | Gladfelter et al. ......................... | 556/27 |
| 5,225,034 | 7/1993 | Yu et al. ................................... | 156/636 |
| 5,350,485 | 9/1994 | Shiraishi et al. .......................... | 156/628 |
| 5,534,462 | 7/1996 | Fiordalice et al. ....................... | 438/190 |
| 5,565,707 | 10/1996 | Colgan et al. ............................ | 257/762 |
| 5,587,339 | 12/1996 | Wyborn et al. .......................... | 438/195 |
| 5,691,009 | 11/1997 | Sandhu ..................................... | 427/534 |
| 5,739,049 | 4/1998 | Park et al. ................................... | 438/3 |
| 5,744,192 | 4/1998 | Nguyen et al. ............................ | 427/99 |
| 5,773,363 | 6/1998 | Derderian et al. ....................... | 438/672 |

OTHER PUBLICATIONS

Complete planarization of via holes with aluminum by selective and nonselective chemical vapor deposition, Kazuo Tsubouchi et al, Research Institute of Electrical Communications, Tohuku University, Katahira 2–1–1, Aoba–ku, Sendai 980, Japan, pp. 1221–1223.

*Primary Examiner*—Joni Chang
*Assistant Examiner*—Kurt Eaton

[57] ABSTRACT

A method for forming a metal line of a semiconductor device includes the steps of: forming an insulating film on a semiconductor substrate including a lower layer line; forming a via hole to partially expose the lower layer line by selectively removing the insulating film; forming a first conductivity material layer on the insulating film including the via hole; forming a plug layer by selectively removing the first conductivity material layer so that it remains only in the via hole; performing a resistance-lowering treatment on the plug layer to remove its impurities; and forming a second conductivity material layer on the insulating film including the plug layer to form an upper layer line.

18 Claims, 5 Drawing Sheets

METHOD OF PURIFYING A METAL LINE IN A SEMICONDUCTOR DEVICE

FIELD OF THE INVENTION

The present invention relates to a multilayer interconnection of a semiconductor device, and more particularly, to a simplified method for forming a metal line of a semiconductor device in which a plug layer has low resistance thereby improving the reliability of the multilayer interconnection.

BACKGROUND OF THE INVENTION

In general, aluminum and aluminum alloy thins film have been widely used as metal line material for semiconductor circuits due to their high conductivity, ease of patterning by dry etching, and excellent adhesion to silicon oxide film, as well as their low cost.

However, as packing densities of semiconductor integrated circuits increase, the sizes of the semiconductor devices have decreased and the metal lines therein have become increasingly more fine and multilayered. In this regard, problems associated with step coverage have become significant for portions of the semiconductor device having a nonplanar or stepped surface, such as a via hole (a hole exposing a conductor as opposed to a contact hole that exposes a semiconductor) or a contact hole.

In a method for forming a metal line using conventional sputtering, the portion of the metal line layer formed on the region having a nonplanar surface becomes thinner due to the shadow effect. In particular, the thickness of the metal line layer becomes significantly thinner at a via hole having aspect ratio (AR) of 1 or more, where AR=(hole height)/(hole diameter)=(hole height)/(hole width in cross section).

Accordingly, instead of a physical deposition like sputtering (which imparts random direction and significant magnitude velocities to the atoms being deposited), the conventional art has relied on the chemical vapor deposition (CVD) method, which is capable of depositing the metal line layer at a uniform thickness. The CVD method produces atoms having random direction velocities, albeit with much lower magnitudes. In order to improve step coverage, a tungsten layer has been formed by using low pressure chemical vapor deposition (LPCVD). However, since the tungsten layer has resistivity two or more times as great as compared to an aluminum layer, it is difficult for the tungsten layer to be applied to the conducting layer.

For this reason, a method for forming a metal line, having a separately formed plug layer in a via hole, has been developed. The plug layer is formed by using CVD to selectively grow a tungsten layer on an exposed substrate in the via hole. Alternatively, formation of the plug layer is preceded by first forming a barrier metal layer or a glue layer, and then depositing a tungsten layer thereon and etching it back by an amount that is greater than its deposition thickness (to produce a plug layer not extending outside the via hole).

However, it is difficult to grow the tungsten layer in the via hole without also growing it on an insulating film, i.e., the selectivity of tungsten between the exposed material in the via hole and the insulation film is not a high value. Also, the other technology requires that a reliable barrier layer or glue layer be formed in the via hole having a high aspect ratio. Here, it is essential that the barrier layer or the glue layer has a minimum thickness sufficient to promote nucleation of the tungsten layer at the bottom and sidewalls of the via hole thus requiring the use of a collimator when sputtering or the use of CVD.

The depth of the via hole depends on the degree of planarization of the insulating film in which the via hole is formed. A depth of the via hole will be different from that of the plug layer because of the varying planarization of the hole. That is, the surface of the plug layer substantially becomes lower than that of the via hole.

Aluminum reflow can be achieved in two ways, by heat treating the aluminum after it is deposited by way of normal temperature or by sputtering at high temperature. For high temperature sputtering, the temperature of the substrate is raised to around 500° C. to thus increase fluidness of an aluminum particle so that the aluminum particle flows to the via hole. Before depositing the aluminum, a lower layer (such as Ti, TiN or stacked arrangement thereof) is used for high adhesion of the aluminum. Aluminum may suffer undesirable step coverage as well as exhibit undesirable surface conditions. For this reason, a void may occur in the via hole or a disconnection may occur at the sides of the via hole.

In the other conventional method for forming a metal line, a conductivity layer of low resistance is deposited by CVD into the via hole to improve step coverage in the via hole. Low resistance materials such as aluminum, Cu and Au are used to be the conductivity layer. The materials DMAH (Dimethylalumiumhydride) or DMEAA (Dimethylethylaminalane) may be used as sources for aluminum, while the material (hafc)Cu(TMVS) may be used as a source for Cu.

However, in the latter conventional method, in general, a surface of a CVD-formed thin film is significantly rough. Thus, in the case that a CVD thin film of 0.5 $\mu$m or less is used as a conductive line, it is difficult to pattern the CVD thin film because the reflectivity of the conductive line is low. Also in such a film electromigration occurs much more easily.

The conventional method for forming a metal line of a semiconductor device will be described with reference to the accompanying drawings.

FIG. 1a to FIG. 1d are sectional views of a metal line of a conventional semiconductor device. FIG. 2a and FIG. 2b are sectional views of a metal line of another conventional semiconductor device.

FIG. 1a to FIG. 1d shows process steps for forming an upper conductive line after forming a tungsten plug layer so as to connect a lower conductive line with the upper conductive line. As shown in FIG. 1a, a lower insulating film 2 is formed on a semiconductor substrate 1 and a lower conductive line 3 is formed on the lower insulating film 2. Subsequently, an upper insulating film 4 is formed on the exposed surfaces (including the lower conductive line 3) and then etched to selectively expose the lower layer line 3, so that a via hole 5 is formed.

As shown in FIG. 1b, a barrier layer 6 is formed on the exposed surfaces including the lower conductive line 3 and sides of the via hole 5. On the barrier layer 6, a first conductive material layer 7 is formed.

The first conductivity material layer 7 and the barrier layer 6 are etched back to form a plug layer 8 in the via hole 5, as shown in FIG. 1c. Here, the first conductivity material layer 7 is overly etched back to completely remove materials remaining on portions of the insulating layer away from the via hole where step coverage occurs.

As shown in FIG. 1d, a second conductive material layer 9 is formed on the exposed surfaces including the via hole 5 and the plug layer 8 therein. The second conductivity material layer 9 is then patterned to form an upper layer line.

FIG. 2a to FIG. 2b shows process steps for forming an upper layer line without additionally forming a plug layer (i.e., a plug layer would lower resistivity between the lower line and the upper line) and, at the same time, for filling the via hole.

As shown in FIG. 2a, a lower insulating film 2 is formed on a semiconductor substrate 1. A lower conductive line 3 is formed on the lower insulating film 2. Subsequently, an upper insulating film 4 is formed on the exposed surfaces including the lower layer line 3 and etched to selectively expose the lower layer line 3 so that a via hole 5 is formed.

As shown in FIG. 2b, a barrier layer 6 is formed on the exposed surfaces including the lower conductive line 3 and sides of the via hole 5. A conductive material layer 7 is CVD deposited on the barrier layer 6 to fill the via hole 5 and then is patterned to form an upper layer line. This simplifies the process steps because the upper layer line is formed by filling the via hole without separately forming the plug layer.

However, the conventional method for forming a metal line of a semiconductor device has several problems.

First, in the case that the plug layer is formed by etch back process according to selective deposition or blanket deposition of tungsten (in order to improve step coverage of the conductivity material layer at the via hole), a glue layer such as Ti, TiN, or TiW should be formed in the via hole to promote nucleation i.e., growth of the plug layer. In addition, resistivity of the plug layer becomes high, namely 5 $\mu\Omega$/cm or above. The glue layer must have a minimum thickness capable of adequately promoting nucleation of the tungsten. For this, a collimator or CVD process is required.

In the case that the via hole is filled while forming an upper layer line for low resistivity in the via hole as shown in FIG. 2, the via hole is filled and at the same time the conductive line is formed by CVD process. In this case, a surface of the conductive line is rough so that reliability of the metal line is reduced.

SUMMARY OF THE INVENTION

Accordingly, the present invention is directed to a method for forming a metal line of a semiconductor device that substantially obviates one or more of the problems due to limitations and disadvantages of the related art.

An object of the present invention is to provide a method for forming a metal line of a semiconductor device in which a plug layer formed in a via hole has low resistance so that the process steps are simplified and reliability of the metal line is improved.

To achieve these and other advantages and in accordance with the purposes of the present invention, as embodied and broadly described, a method for forming a metal line of a semiconductor device according to the present invention includes the steps of: forming an insulating film on a semiconductor substrate including a lower layer line; forming a via hole to partially expose the lower layer line by selectively removing the insulating film; forming a first conductivity material layer on the insulating film including the via hole; forming a plug layer by performing etch back process to remain the first conductivity material layer in only the via hole; performing a resistance-lowering treatment on the plug layer to remove its impurities; and forming a second conductivity material layer on the insulating film including the plug layer to form an upper layer line.

The foregoing and other objectives of the present invention will become more apparent from the detailed description given hereinafter. It should be understood, however, that the detailed description and specific examples, while indicating preferred embodiments, are given by way of illustration only, because various changes and modifications within the spirit and scope of the invention will become apparent to those skilled in the art from this detailed description and specific examples.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description serve to explain the principles of the invention, but are not meant to limit the scope of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIG. 3a to FIG. 3e are sectional views of process steps of a metal line of a semiconductor device according to the present invention.

The present invention improves the process steps of forming a plug layer of a conductive material in a via hole having a high aspect ratio, so that step coverage is improved, so that the process steps are simplified, and so that resistivity of the plug layer is lowered.

Figure 1A:
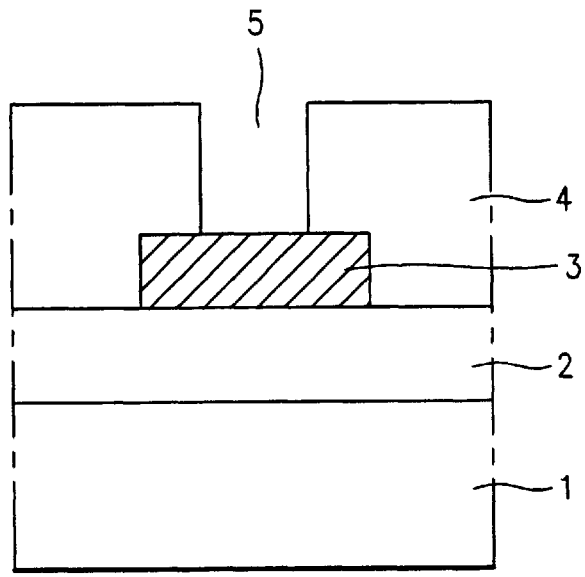
FIG. 1a to FIG. 1d are sectional views of conventional process steps for forming a metal line of a conventional semiconductor device.
Figure 1B:
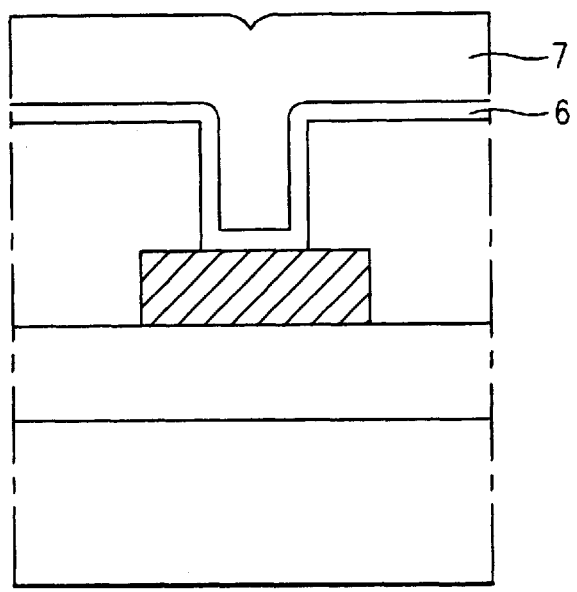
Figure 1C:
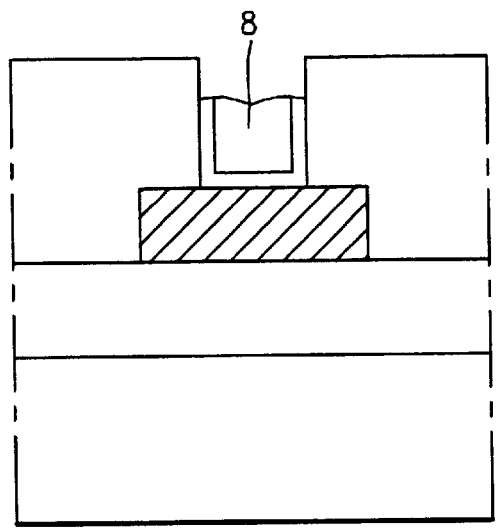
Figure 1D:
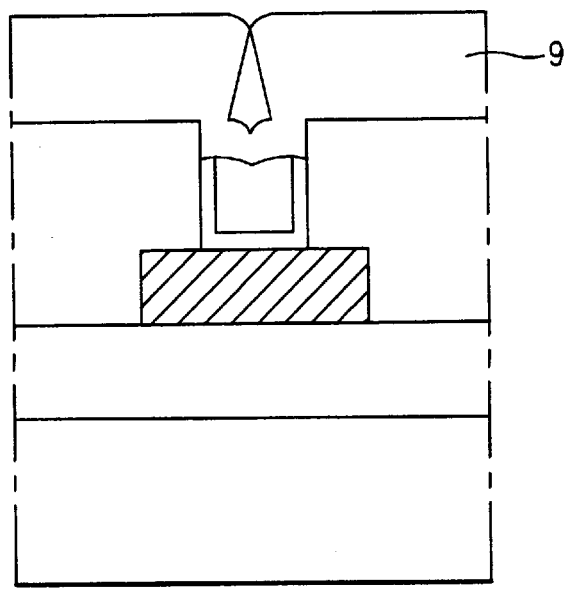
Figure 2A:
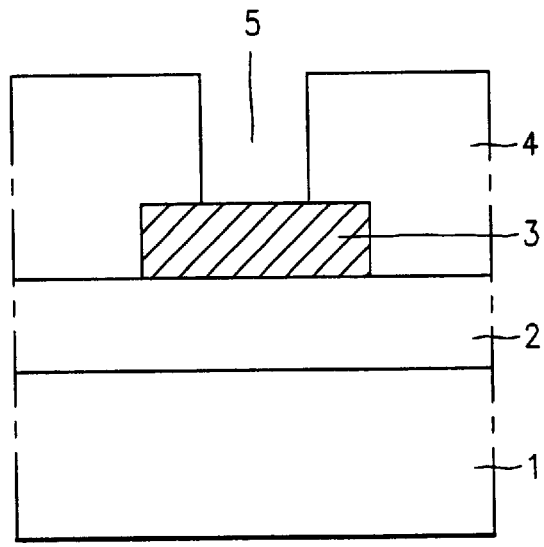
FIG. 2a and FIG. 2b are sectional views of alternative conventional process steps of a metal line of another conventional semiconductor device according to the prior art.
Figure 2B:
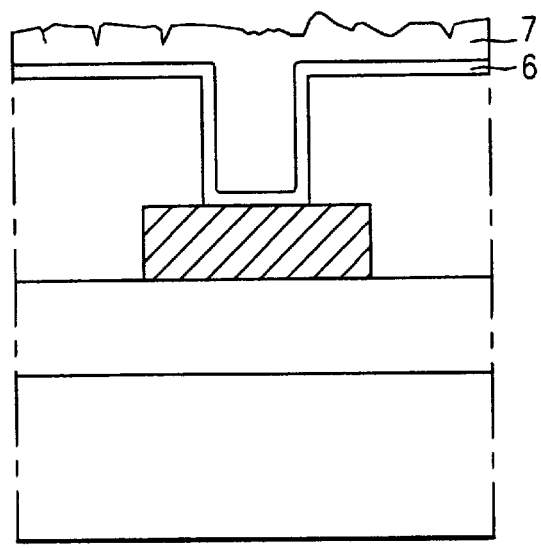
Figure 3A:
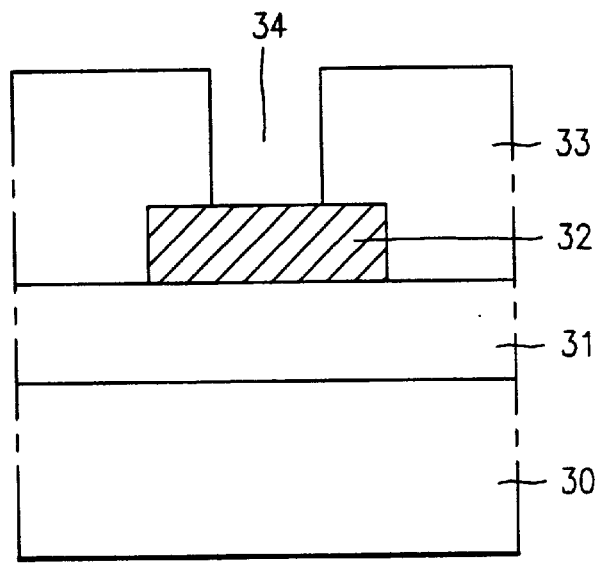
FIG. 3a to FIG. 3e are sectional views of process steps of a metal line of a semiconductor device according to the present invention.

As shown in FIG. 3a, a lower insulating film 31 is formed on a semiconductor substrate 30. A lower layer line 32 is formed on the lower insulating film 31. An upper insulating film 33 is formed on the exposed surfaces including the lower layer line 32. The upper insulating film 33 is then etched to selectively expose the lower layer line 32 by way of a via hole 34.

Figure 3B:
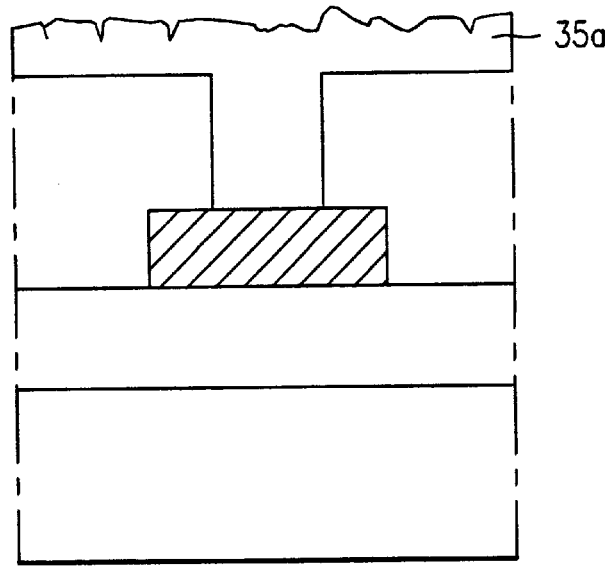

As shown in FIG. 3b, a first conductive material layer 35a is formed on the exposed surfaces including the lower layer line 32 (exposed by the via hole 34) using plasma assisted CVD (PACVD). The plasma is formed, e.g., using a power of about 5W to 15W and a carrier gas or a source gas may be applied.

In the case that Al is used to be the first conductive material layer 35a, Al film is formed on the exposed lower layer line 32 and against the sides of the upper insulating film 33 in the via hole 34. Organic metal compound sources such as DMAH or DMEAA are used in a CVD process, performed by a metal organic chemical vapor deposition (MOCVD) apparatus, to form the layer 35a.

Desirably, DMEAA, that is, $((CH_3)_2(CH_3CH_2)N)AlH_3$ is provided to the MOCVD apparatus by bubbling hydrogen carrier gas through liquid DMEAA so that the DMEAA is gasified. In this case, the pressure is in the range of about 0.5 to 5 Torr, the gas flow rate is in the range of about 100 to 1000 sccm (standard cubic centimeters per minute), and temperature is in the range of about 130° C. to 170° C.

In the case that Cu is used to be the first conductive material layer 35a, the first conductivity material layer 35a is formed by an MOCVD apparatus using a liquid source such as (hfac)Cu(TMVS) (hexafluroacetylacetonate Cu trimethylvinylsilane) or a solid source such as $Cu(hfac)_2$, as a source of gas. At this time, the deposition temperature ranges between about 100° C. and 200° C. and the deposition thickness ranges from about 1000 Å to about 2000 Å.

Figure 3C:
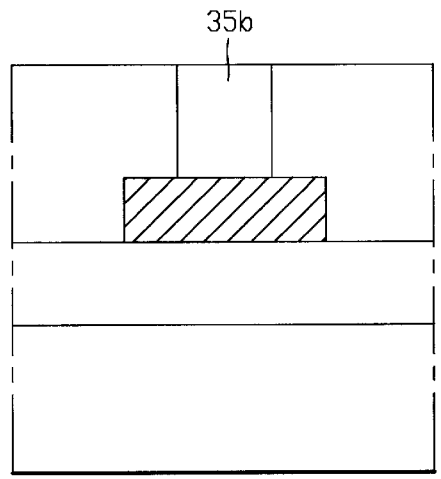

Subsequently, as shown in FIG. 3c, the first conductive material layer 35a is etched back to form a plug layer 35b which substantially fills the via hole 34. Here, in the case that the first conductive material layer 35a is Al, the first conductive material layer 35a is etched back by anisotropic dry etching using a plasma of gas such as $Cl_2$.

In order to prevent a recess from occurring in the plug layer 35b, a chemical mechanical polishing (CMP) process may be applied using a slurry which includes polish such as silica and additives such as $HNO_3$ and HOCl.

Figure 3D:
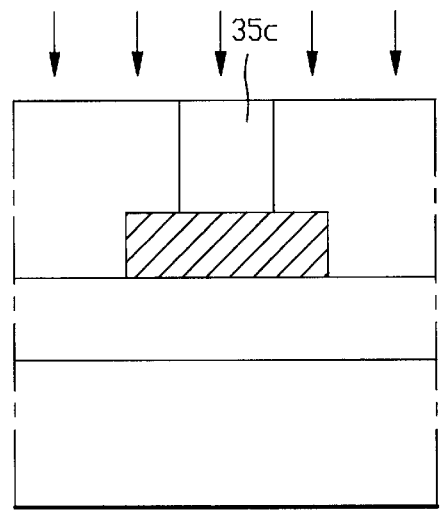

As shown in FIG. 3d, to lower the resistivity of the plug layer 35b, the plug layer 35b is heat treated at temperature between about 300° C. and 500° C. or plasma treated in the reactant environment, e.q., an environment of $H_2$, $O_2$ or their mixture, to remove main impurities, e,g., carbon. In the plasma treatment, which is indicated by the downward-pointing arrows in FIG. 3d, the pressure is in the range of about 0.5 to 5 Torr, gas flow rate is in the range of about 100 to 1000 sccm, and temperature is in the range of about 130° C. to 170° C. The resistivity of the plug layer 35b is lowered because the main impurity, C, is driven out, e.g., in the form of $CH_4$ or $CO_2$. The lower resistivity, higher purity plug is denoted in FIG. 3d as item 35c. The impure plug layer 35b has a high resistivity comparable to tungsten while the purified plug 35c has a low resistivity nearly equivalent to pure aluminum.

According to the resistance-lowering treatment discussed above, resistivity of the plug layer 35b is reduced to about 4 $\mu\Omega$/cm or below.

Alternatively, such resistance-lowering treatment of the plug layer 35b may be performed before forming the plug layer 35b, i.e., before the etch back depicted in FIG. 3c.

Figure 3E:
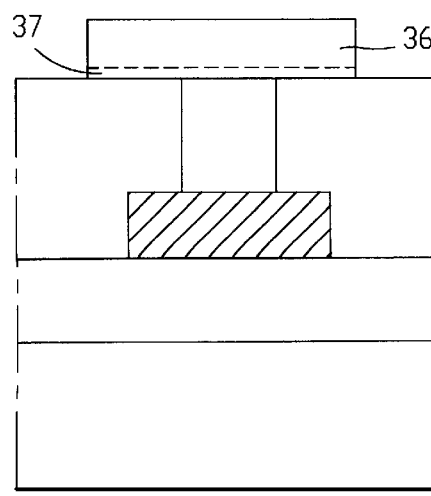

As shown in FIG. 3e, a second conductive material layer 36 is formed on the exposed surfaces including the plug layer 35c (on which low resistance treatment has been performed) by physical deposition such as sputtering. The resulting film has excellent planarization. The second conductive material layer 36 is formed of metal materials such as Al, Cu and Ag, and has a thickness of about 3000 Å to 5000 Å. The second conductive material layer 36 is then patterned to form an upper layer line.

In the method for forming a metal line of a semiconductor device discussed above, the first conductive material layer 35a and the second conductive material layer 36 may be different from each other in their main composition. In the case that there is reaction (that can form a high resistivity compound between the layers) between the first and second conductive material layers, a barrier layer 37 is further formed therebetween to control the reaction. Because it is optional, the barrier layer 37 is depicted with a broken line. The material for the barrier layer includes conductive materials having a high melting point, such as Ti, TiN, a stacked layer of Ti and TiN, WN, and Ta. In addition, the barrier layer is formed by physical deposition such as sputtering and has a thickness of about 300 Å to 500 Å.

In order to lower resistance of the metal line, in the case that the first conductive material layer 35a is formed of Al and the second conductivity material layer 36 is formed of a material such as Cu, which has high reaction with Al, the reaction between two materials can effectively be avoided by forming the barrier layer.

In the case that the barrier layer is thin, e.g., having a thickness of about 200 Å or below, Cu (the second conductive material layer 36) may be diffused into the Al film (the first conductive material layer 35a) at a predetermined concentration by a heat treatment process. In this case, since it is possible for the Al film to be changed (doped) to an alloy film which includes Cu atoms, the electromigration characteristic of the Al film (the lower conductive material layer 35b) can be improved and spike formation (which can, e.g., disrupt a source/drain junction or impurity region) of aluminum into the semiconductor substrate can be reduced.

The method for forming a metal line of a semiconductor device according to the present invention has the following advantages.

Since the plug layer can be formed on the insulating film including the via hole by a non-selective CVD process using plasma, the glue layer (for promoting nucleation on the exposed surface of the lower line in the via hole) need not to be formed. This simplifies the process steps.

Impurities of the plug layer are removed by heat treatment or plasma treatment to reduce resistivity of the plug layer so that the metal line conductivity characteristic is improved.

In addition, since the conductive material used as the main metal line is formed by physical deposition, the surface of the conductive line exhibits an excellent, i.e., low, degree of roughness. This improves planarization of the metal line.

It will be apparent to those skilled in the art that various modifications and variations can be made in the method for forming the metal line of the semiconductor device of the present invention without departing from the spirit or scope of the invention. Thus, it is intended that the present invention cover the modifications and variations of the invention that would be obvious to one of ordinary skill in the art and are intended to be included within the scope of the appended claims and their equivalents.

What is claimed is:

1. A method for forming a metal line of a semiconductor device comprising:

providing a substrate;

forming a lower conductive line on said substrate;

forming an insulating film on a substrate and on said lower conductive line;

forming a via hole in said insulating film to at least partially expose said lower conductive line;

forming a first conductive material layer of aluminum or copper on said insulating film and in said via hole;

selectively removing said first conductive material layer to form a plug layer;

purifying said plug layer to lower the resistivity thereof, said purifying including heat treating in a temperature range between about 300° C. and 500° C. with $O_2$ or a mixture of $O_2$ and $H_2$ to drive impurities including carbon out of said plug layer; and forming a second conductive material layer on said insulating film and said plug layer to form an upper conductive line.

2. The method for forming a metal line of a semiconductor device as claimed in claim 1, wherein said step of selectively removing includes performing an etch back process.

3. The method for forming a metal line of a semiconductor device as claimed in claim 2, wherein said step of performing an etch back process includes anisotropically dry etching said first conductive material layer with a plasma of $Cl_2$ if said first conductive material layer includes Al.

4. The method for forming a metal line of a semiconductor device as claimed in claim 1, wherein said step of selectively removing includes chemical mechanical polishing (CMP).

5. The method for forming a metal line of a semiconductor device as claimed in claim 4, wherein said step of CMP includes using a slurry having a polish including silica and at least one of $HNO_3$ and HOCl.

6. The method for forming a metal line of a semiconductor device as claimed in claim 1, wherein said first conductive material layer includes at least one of Al, Ag, Cu, or an alloy thereof.

7. The method for forming a metal line of a semiconductor device as claimed in claim 6, wherein said step of forming said first conductive material layer includes performing CVD using an MOCVD apparatus, said MOCVD apparatus using one of DMAH or DMEAA as a source of gas if said first conductive material layer includes Al.

8. The method for forming a metal line of a semiconductor device as claimed in claim 7, wherein said step of performing CVD includes providing said DMEAA to said MOCVD apparatus by bubbling hydrogen carrier gas through liquid DMEAA, at a pressure of about 0.5 to 5 Torr, at a gas flow rate of about 100 to 1000 sccm, and at a temperature between about 130° C. and 170° C.

9. The method for forming a metal line of a semiconductor device as claimed in claim 6, wherein said step of forming said first conductive material layer includes performing CVD using an MOCVD apparatus, said MOCVD apparatus using one of a liquid source (hfac)Cu(TMVS) and a solid source $Cu(hfac)_2$ as a source of gas if said first conductive material layer includes Cu.

10. The method for forming a metal line of a semiconductor device as claimed in claim 9, wherein said step of performing CVD includes setting a deposition temperature of Cu in a range of about 100° C. to 200° C. and a deposition thickness in a range of about 1000 Å to 2000 Å.

11. A method for forming a metal line of a semiconductor device comprising:
providing a substrate;
forming a lower conductive line on said substrate;
forming an insulating film on a substrate and on said lower conductive line;
forming a via hole in said insulating film to at least partially expose said lower conductive line;
forming a first conductive material layer of aluminum or copper on said insulating film and in said via hole;
selectively removing said first conductive material layer to form a plug layer;
purifying said plug layer to lower the resistivity thereof, said purifying including plasma treating in an environment of at least one of $O_2$ or a mixture of $O_2$ and $H_2$, in an MOCVD apparatus at a pressure of about 0.5 to 5 Torr, a gas flow rate of about 100 to 1000 sccm, and a temperature between about 130° C. and 170° C. with to drive impurities including carbon out of said plug layer; and
forming a second conductive material layer on said insulating film and said plug layer to form an upper conductive line.

12. The method for forming a metal line of a semiconductor device as claimed in claim 1, wherein said step of purifying is performed prior to said step of selectively removing.

13. The method for forming a metal line of a semiconductor device as claimed in claim 1, wherein said step of forming said second conductive material layer includes sputtering.

14. The method for forming a metal line of a semiconductor device as claimed in claim 1, wherein said step of forming said second conductive material layer includes using at least one of Al, Cu and Ag and setting a thickness of said second conductivity material layer to be in a range of about 3000 Å to 5000 Å.

15. The method for forming a metal line of a semiconductor device as claimed in claim 1, further comprising the step of forming a barrier layer between said plug layer and said second conductive material layer to control a reaction between said plug layer and said second conductive material layer.

16. The method for forming a metal line of a semiconductor device as claimed in claim 15, wherein said step of forming said barrier layer includes using at least one of the following conductive materials having a high melting point, Ti, TiN, a stacked layer of Ti and TiN, WN, and Ta, and sputtering said barrier layer to a thickness of about 300 Å to 500 Å.

17. The method for forming a metal line of a semiconductor device as claimed in claim 15, wherein said barrier layer has a thickness of about 200 Å or below and said method further includes heating to diffuse atoms of said second conductive material layer to form a predetermined concentration thereof in said plug layer if said plug layer includes Al and said second conductive material layer includes a material having a reaction with Al comparable to a reaction of Cu with Al.

18. The method for forming a metal line of a semiconductor device as claimed in claim 1, wherein said plug layer does not extend beyond said via hole.

* * * * *